US008914692B2

(12) United States Patent
Goel

(10) Patent No.: US 8,914,692 B2
(45) Date of Patent: *Dec. 16, 2014

(54) DRAM TEST ARCHITECTURE FOR WIDE I/O DRAM BASED 2.5D/3D SYSTEM CHIPS

(75) Inventor: Sandeep Kumar Goel, Los Gatos, CA (US)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 295 days.

This patent is subject to a terminal disclaimer.

(21) Appl. No.: 13/484,729

(22) Filed: May 31, 2012

(65) Prior Publication Data

US 2013/0047046 A1 Feb. 21, 2013

Related U.S. Application Data

(60) Provisional application No. 61/524,487, filed on Aug. 17, 2011.

(51) Int. Cl.
*G01R 31/28* (2006.01)
*G11C 29/56* (2006.01)
*G11C 11/40* (2006.01)

(52) U.S. Cl.
CPC ....... *G11C 29/56* (2013.01); *H01L 2924/15192* (2013.01); *H01L 2224/16225* (2013.01); *G11C 29/56016* (2013.01); *G11C 11/40* (2013.01); *H01L 2924/15311* (2013.01); *G11C 2029/5602* (2013.01)
USPC .......................................................... 714/727

(58) Field of Classification Search
CPC ................. H01L 2924/00; H01L 2224/48227; H01L 2224/32145; H01L 2224/16145; H01L 25/0657; H01L 2924/1431; H01L 2924/1434; H01L 2924/15153; G11C 2029/5602; G11C 29/56
USPC .................... 714/727, 733, 734, 30, E11.155; 365/200; 257/777, E25.013, E21.499, 257/686
See application file for complete search history.

(56) References Cited

U.S. PATENT DOCUMENTS

| 7,894,229 | B2 * | 2/2011 | Lahtinen et al. ................. 365/51 |
| 8,421,245 | B2 * | 4/2013 | Gonzalez et al. ............. 257/777 |
| 2013/0044554 | A1 * | 2/2013 | Goel et al. .................... 365/200 |

* cited by examiner

*Primary Examiner* — Phung M Chung
(74) *Attorney, Agent, or Firm* — Duane Morris LLP

(57) ABSTRACT

A 2.5D or 3D test architecture includes a logic die, and a memory die. In the 2.5D architecture, the logic die and memory die are mounted on an interposer. In the 3D architecture, the memory die is mounted on the logic die. The logic die includes a control logic wrapped with a processor wrapper. The processor wrapper enables testing components of the control logic. The memory die is also mounted on the interposer. The memory die includes dynamic random access memory and channel selection/bypass logic. The control logic is coupled to the dynamic random access memory via the channel selection/bypass logic, the channel selection/bypass logic being controlled by the processor wrapper.

20 Claims, 7 Drawing Sheets

US 8,914,692 B2

DRAM TEST ARCHITECTURE FOR WIDE I/O DRAM BASED 2.5D/3D SYSTEM CHIPS

This application claims priority to U.S. Provisional Patent Application No. 61/524,487, entitled DESIGN FOR TEST ARCHITECTURE FOR WIDE 10 DRAM BASED 2.5D/3D SYSTEM CHIPS, filed Aug. 17, 2011, which is expressly incorporated by reference herein in its entirety.

BACKGROUND

1. Technical Field

Aspects of the present disclosure relate in general to electronic circuitry. In particular, aspects of the disclosure include a test process for Dynamic Random Access Memory (DRAM) in 2.5D/3D System Chips.

2. Description of the Related Art

With conventional two-dimensional (2D) computer chips, a processor and random access memory (RAM) are located on the same plane, and connected via a package substrate.

However, as the electronics industry evolves, chips are now taking advantage of the third dimension—wide input/output dynamic random access memory coupled on top of a processor (3D) or next to a processor via an interposer (2.5D). In such instances, the placement in the third dimension reduces interconnect capacitance between the two components.

SUMMARY

Embodiments include 2.5D and 3D test architectures.

A 2.5D test architecture embodiment includes an interposer, a logic die, and a memory die. The interposer is mounted on a package substrate. The logic die is mounted on the interposer; the logic die includes a control logic wrapped with a processor wrapper. The processor wrapper enables testing components of the control logic. The memory die is also mounted on the interposer. The memory die includes dynamic random access memory and channel selection/bypass logic. The control logic is coupled to the dynamic random access memory via the channel selection/bypass logic, the channel selection/bypass logic being controlled by the processor wrapper.

A 3D test architecture comprises a logic die and a memory die. The logic die is mounted on a package substrate. The logic die includes a control logic wrapped with a processor wrapper. The processor wrapper enables testing components of the control logic. The memory die is mounted on the logic die. The memory die includes dynamic random access memory and channel selection/bypass logic, the control logic is coupled to the dynamic random access memory via the channel selection/bypass logic, the channel selection/bypass logic being controlled by the processor wrapper.

A process implements a design for test architecture for wide input/output stacked DRAM dies. An interposer is mounted on a package substrate. The logic die is mounted on the interposer. The logic die includes a control logic wrapped with a processor wrapper. The processor wrapper is configured to enable testing components of the control logic. A memory die is mounted a on the interposer. The memory die includes dynamic random access memory and channel selection/bypass logic; the control logic is coupled to the dynamic random access memory via the channel selection/bypass logic, the channel selection/bypass logic is controlled by the processor wrapper.

DETAILED DESCRIPTION

Figure 1:
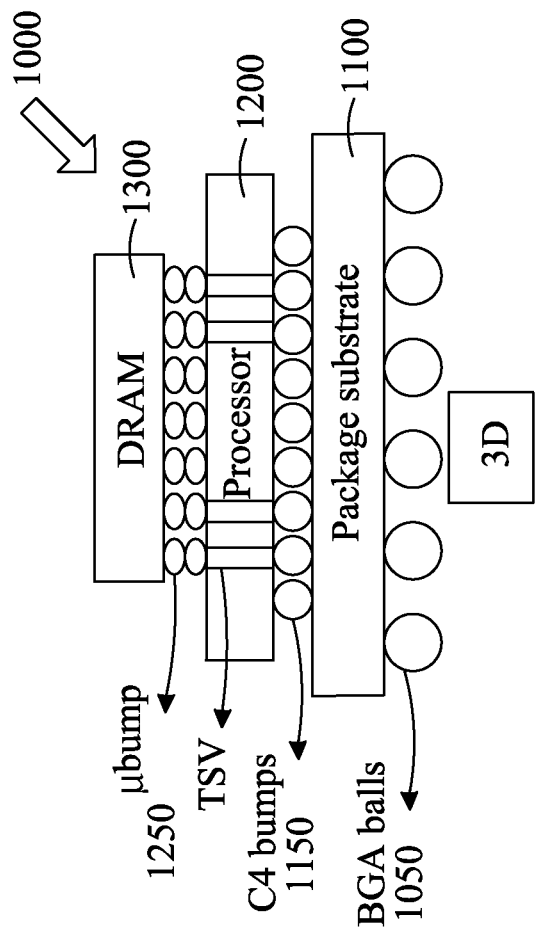
FIG. 1 depicts a 3D system embodiment.

One aspect of the present disclosure includes a test architecture for stacked dies. Stacked dies includes Wide Input/Output dynamic random access memory and other logic dies. Such a test architecture enables individual die tests, and interconnect tests between dies. Some embodiments of the test architecture are compliant with the Institute of Electrical and Electronics Engineers (IEEE) 1149.1 Standard Test Access Port and Boundary-Scan Architecture for board-level integration of 2.5D/3D dies. An industry standard name for IEEE 1149.1 is Joint Test Action Group (JTAG).

Embodiments minimize area overhead while reusing system on a chip ("SOC") test infrastructure and test patterns. Yet other embodiments interface with wide I/O DRAM boundary scan control and register with no test access port (TAP) controller.

The following embodiments are described in a plurality of sections. Further, circuit elements making up each of functional blocks of the following embodiments are formed on a semiconductor substrate made of a single crystal silicon by use of the known integrated circuit (IC) technology for Complementary Metal Oxide Semiconductors (CMOS) transistors.

Embodiments of the disclosure will be described hereinafter with reference to the drawings. In all the drawings for use describing the embodiments, identical members are in principle denoted by like reference numerals, thereby omitting detailed description thereof.

Let us now turn to an embodiment of a 3D chip system 1000, shown in FIG. 1, constructed and operative in accordance with an embodiment of the current disclosure. A 3D chip system is one in which components are connected in three dimensions: length, width, and height. As shown in FIG. 1, in a 3D chip system 1000, a wide I/O DRAM 1300 are stacked on top of a processor 1200 via microbumps 1250. Processor 1200 is similarly stacked on a package substrate 1100 via C4 bumps (solder bumps) 1150. The package substrate 1100 is surface-mounted using a ball gate array (BGA) 1050. As is discussed below, test embodiments of the present disclosure can be used in a 3D chip system 1000.

Figure 2:
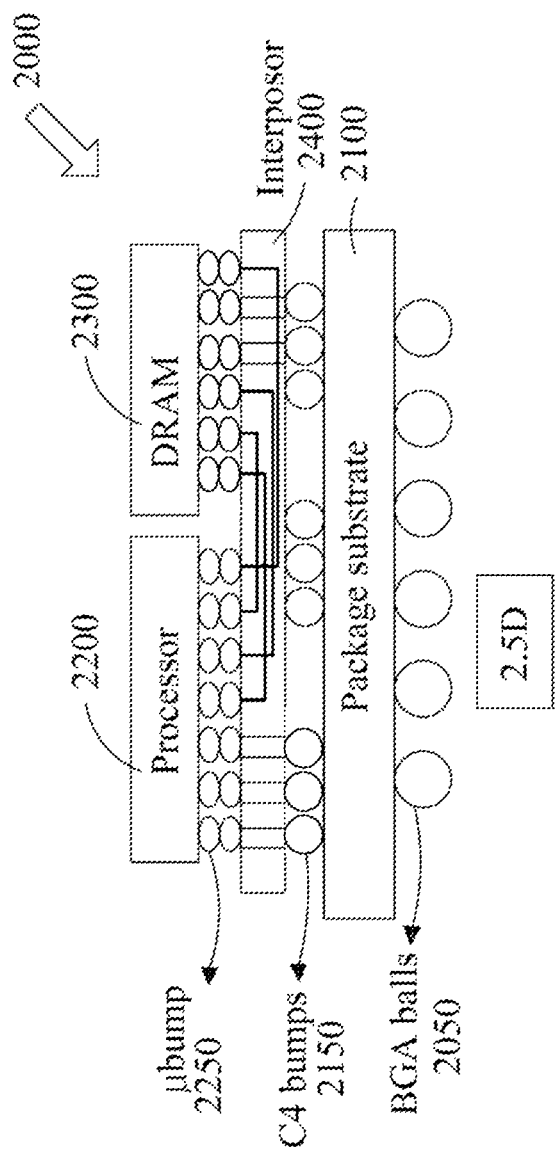
FIG. 2 illustrates 2.5D system embodiment.

Similarly, test embodiments can be used in conjunction with a 2.5D chip system 2000, shown in FIG. 2, constructed and operative in accordance with an embodiment of the current disclosure. A 2.5D chip system 2000 is one in which components, such as processor 2200 and dynamic random access memory 2300 are coupled to a package substrate 2100 in three dimensions via an interposer 2400. As shown in FIG. 2, components processor 2200 and DRAM 2300 are stacked on top of a interposer 2400 via microbumps 2250. Interposer 2400 is similarly stacked on package substrate 2100 via C4 bumps 2150. The package substrate 2100 is surface mounted using ball gate array 2050. As is discussed below, test embodiments of the present disclosure can be used in a 2.5D chip system 2000.

Figure 3:
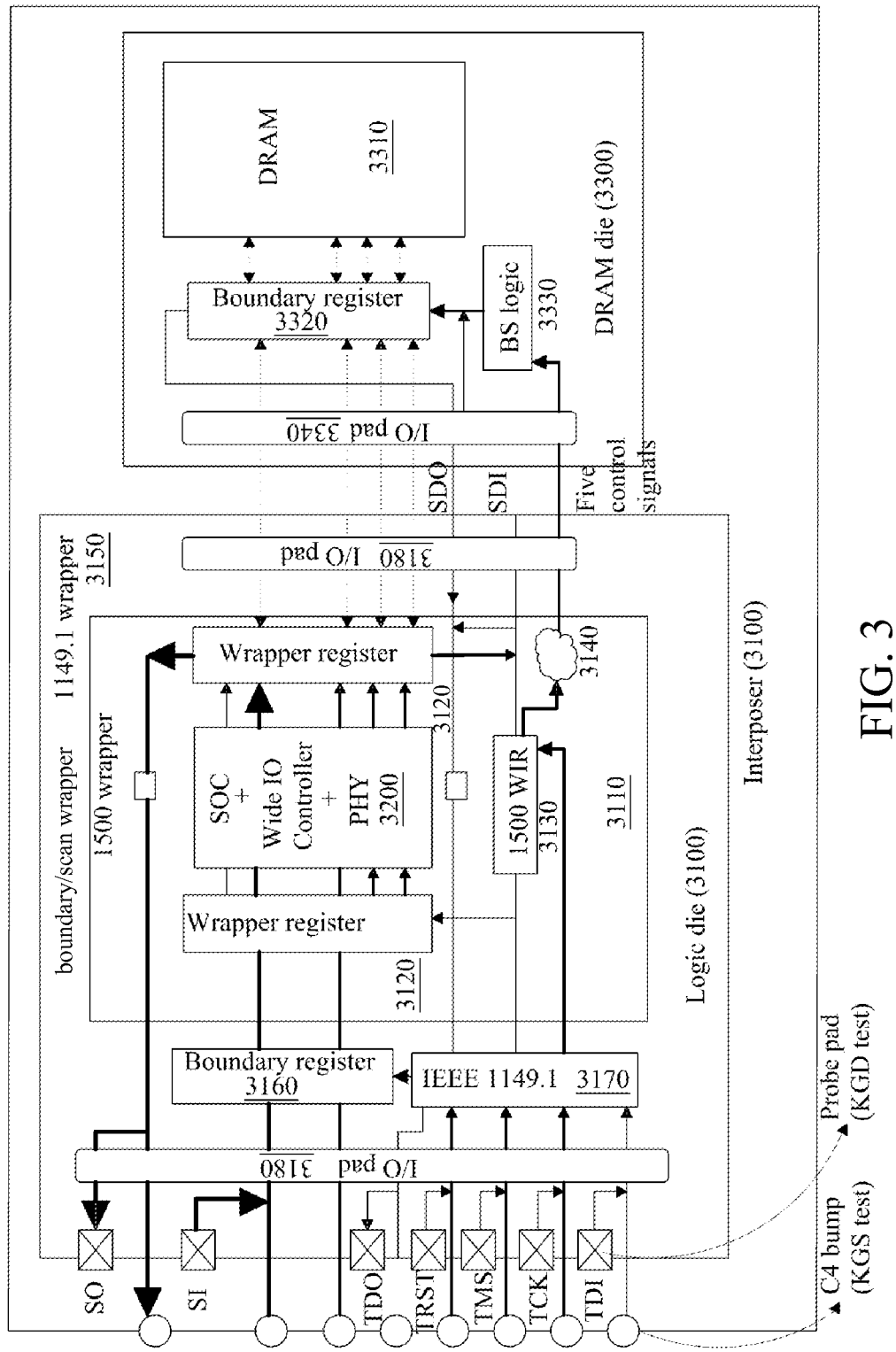
FIG. 3 is a block diagram of a design for test (DFT) architecture for a single wide input/output DRAM channel.

FIG. 3 illustrates a design for test (DFT) architecture for a single wide input/output DRAM channel, constructed and operative in accordance with an embodiment of the current disclosure. In this 2.5D embodiment, a logic die 3200 and a dynamic random access memory die 3300 are mounted on interposer 3400. It is understood by those practiced in the art that the principles described herein may also apply to a 3D embodiment.

In this embodiment, logic die 3200 comprises a processor 3200 wrapped with a processor wrapper 3110. Processor wrapper 3110 is an Institute of Electrical and Electronics Engineers (IEEE) Std. 1500 wrapper. The processor wrapper 3110 can also wrap at least one wrapper register 3120A-B, a Wrapper Instruction Register (WIR) 3130 and logic to data adapter 3140.

Processor 3200 is a System on a Chip including a Wide Input/Output Controller and physical layer (PHY).

Processor wrapper 3110 enables test reuse and integration for embedded cores and associated circuitry. Processor wrapper 3110 foregoes addressing analog circuits and focuses on facilitating efficient test of digital aspects of systems on chip. Furthermore, processor wrapper 3110 has serial and parallel test access mechanisms (TAMs) and a rich set of instructions suitable for testing cores, System on a Chip interconnect, and circuitry. In addition, processor wrapper 3110 includes features that enable core isolation and protection.

Figure 6:
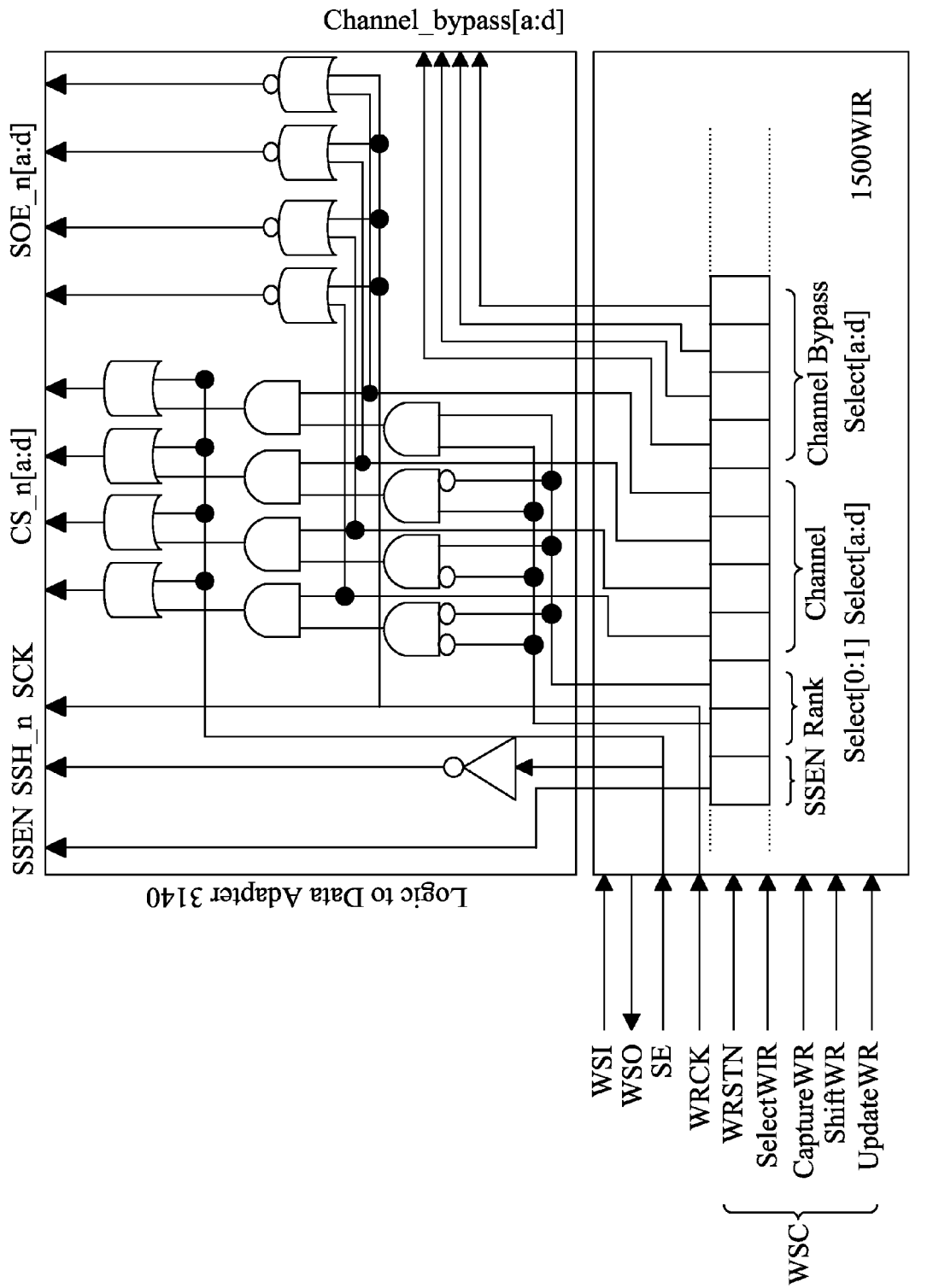
FIG. 6 illustrates on an implementation of a logic to data adapter of a design for test architecture for wide input/output stacked DRAM dies.

In some embodiments, Wrapper Instruction Register 3130 is a IEEE 1500 Wrapper Instruction Register. FIG. 6 depicts an implementation of Wrapper Instruction Register 3130 and logic to data adapter 3140, constructed and operative in accordance with an embodiment of the current disclosure.

Returning to FIG. 3, logic die 3200 further comprises a boundary scan wrapper 3150. In some embodiments, boundary scan wrapper 3150 is an IEEE Std. 1149.1 wrapper architecture and access mechanism designed to enable testing components of a board. Boundary scan wrapper 3150 wraps processor wrapper 3110, a boundary register 3160, a boundary scan wrapper instruction register 3170, and any input/output pads 3180. Boundary scan wrapper instruction register 3170 is an IEEE 1149.1 wrapper instruction register.

Channel selection/bypass logic 3330 and boundary scan registers 3320 is controlled by the control-logic 3200 on logic/processor die 3200.

Control logic 3200 is controlled by the Wrapper Instruction Register 3130 or directly by the top-level boundary scan wrapper instruction register 3170.

It is understood by those practiced in the art that logic die pins connected to interposer 3100 or a substrate with boundary scan logic.

Logic test pins (not shown) are connected to probe pads for Known Good Die (KGD) testing and C4 bumps for FT/KGS testing.

Dynamic Random Access memory die 3300 comprises dynamic random access memory 3310, DRAM boundary scan registers 3320, DRAM channel selection/bypass logic 3330, and input/output pads 3340. DRAM channel selection/bypass logic 3330 performs as the interface between the logic die 3200 and the DRAM die 3300. It is further understood that an individual channel can be selected for interconnect test between logic die 3200 and DRAM die 3300.

Figure 4:
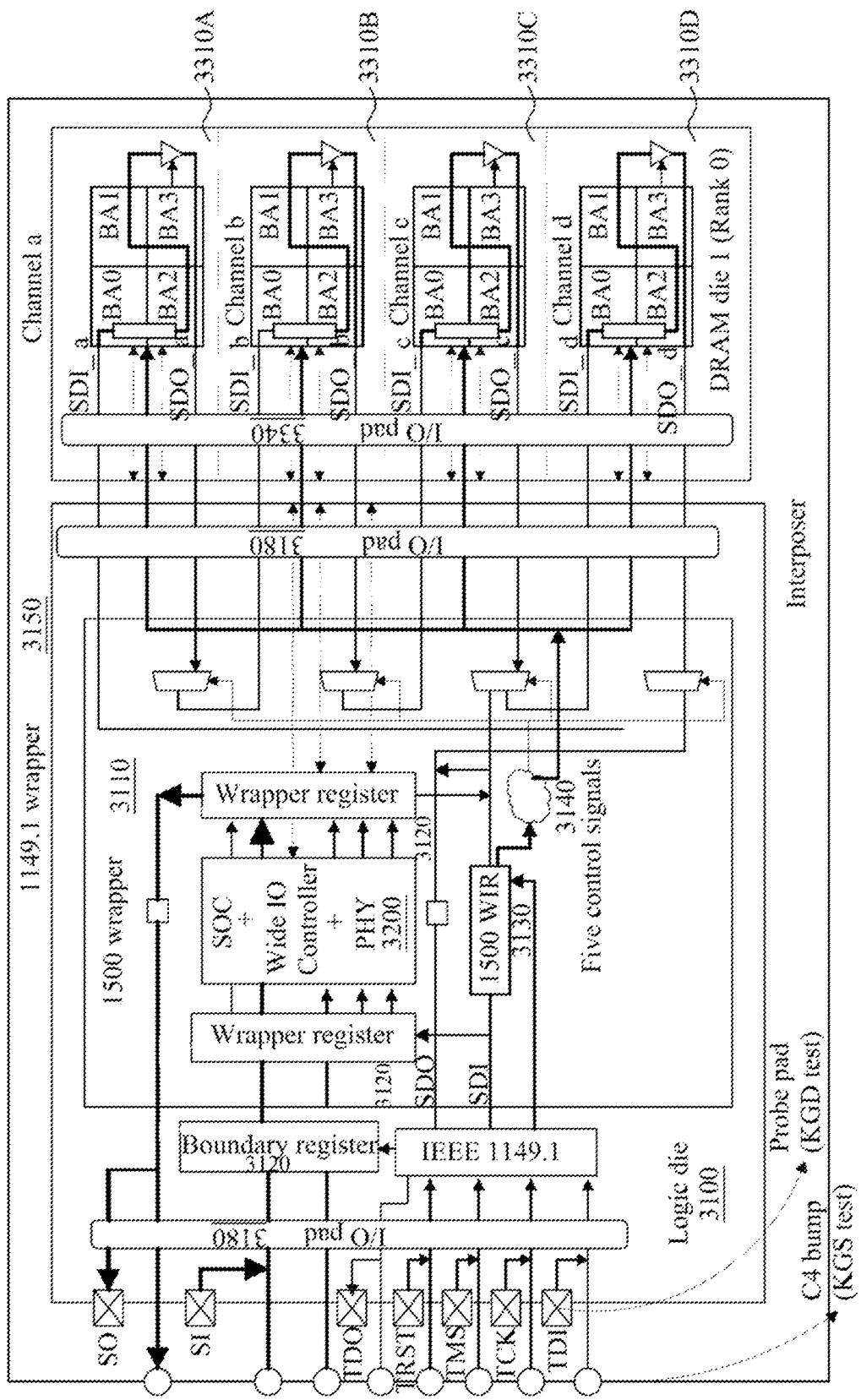
FIG. 4 elaborates on an implementation of a design for test architecture for a single wide input/output DRAM die.

FIG. 4 elaborates on an implementation of a design for test architecture for a single wide input/output DRAM die, constructed and operative in accordance with an embodiment of the current disclosure. This 2.5D embodiment, further describes the DRAM die of FIG. 3. It is understood by those practiced in the art that the principles described herein may also apply to a 3D embodiment.

In this embodiment, logic die 3200 and a dynamic random access memory die 3300 are mounted on interposer 3400. DRAM die 3300 has four channels per die, and four banks in each channel. Each channel has separate boundary scan signals, and only a SSEN signal (global scan enable) is shared among all channels.

Figure 5:
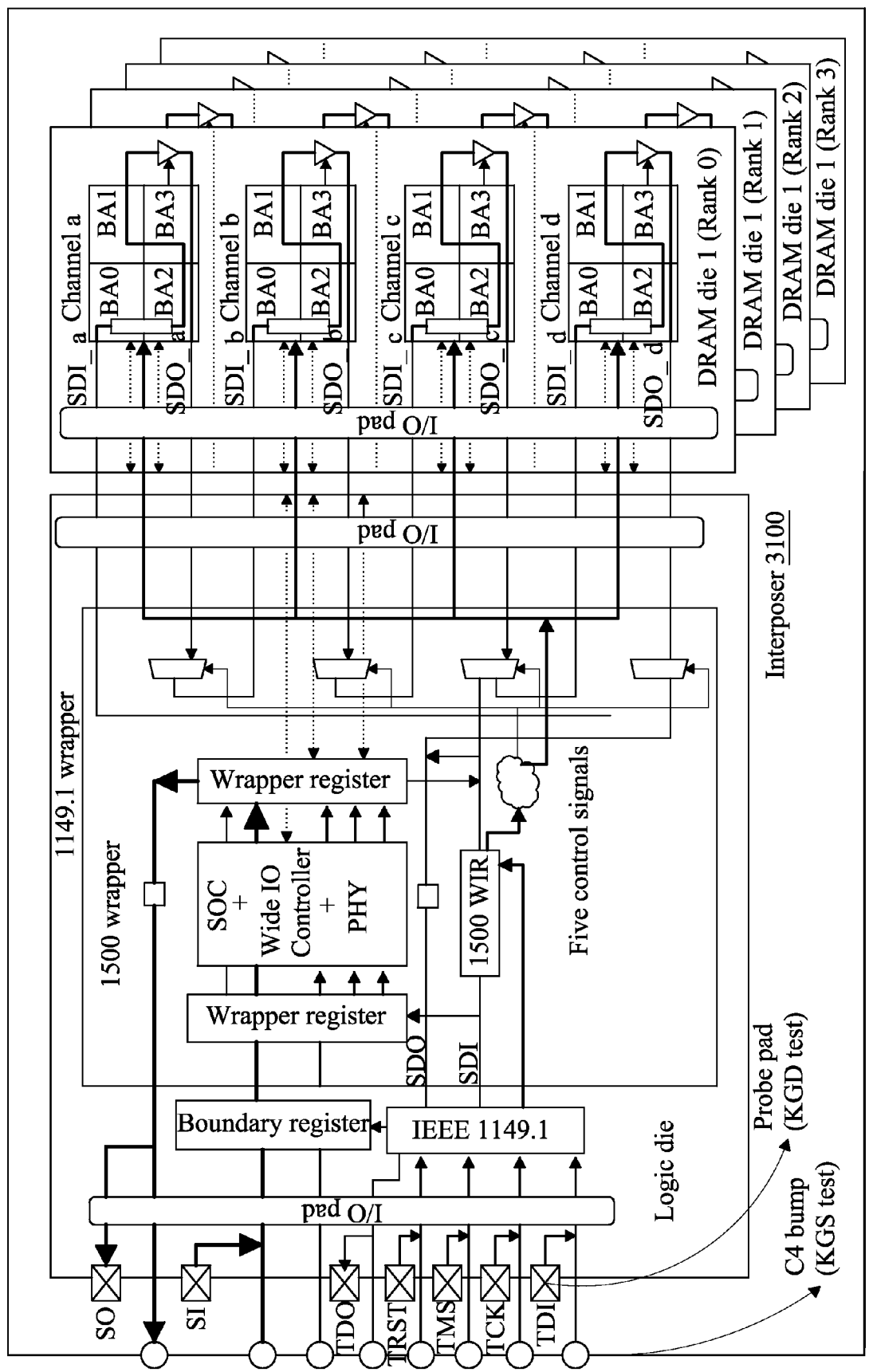
FIG. 5 illustrates on an implementation of a design for test architecture for wide input/output stacked DRAM dies.

FIG. 5 illustrates on an implementation of a design for test architecture for wide input/output stacked DRAM dies, constructed and operative in accordance with an embodiment of the current disclosure. This embodiment is depicted as a 2.5D embodiment, although it is understood by those practiced in the art that the principles described herein may also apply to a 3D embodiment.

In this embodiment, logic die 3200 and four dynamic random access memory dies 3300A-D are mounted on interposer 3400. DRAM dies 3300A-D each have four channels per die, and four banks in each channel. Each channel has separate boundary scan signals, and only a SESN signal (global scan enable) is shared among all channels. Because there are a total of four dies in a wide input/output DRAM stack, there are a total of sixteen channels, and 16 chip select (CS) pins for each channel. Channels between dies may share the same boundary scan pins.

FIG. 6 illustrates on an implementation of a Wrapper Instruction Register (WIR) 3130 and logic to data adapter 3140 for test architecture for wide input/output stacked DRAM dies, constructed and operative in accordance with an embodiment of the current disclosure. This embodiment can be used in a 2.5D or 3D embodiments.

Figure 7:
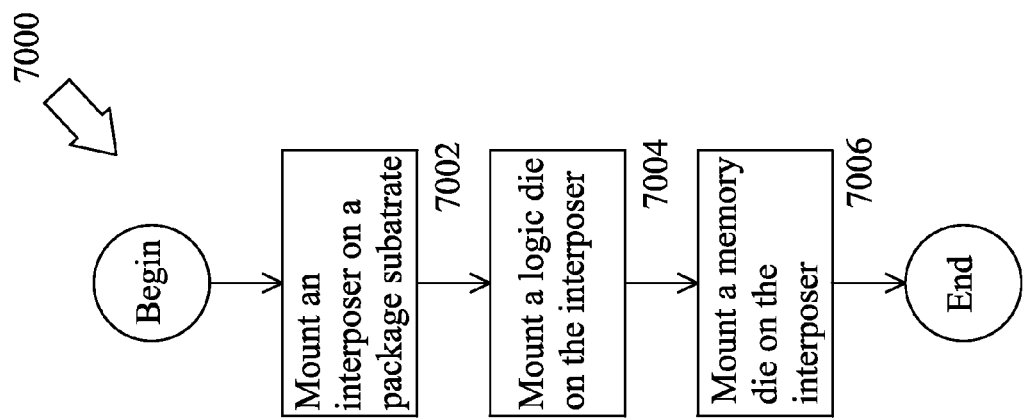
FIG. 7 illustrates a process of implementing a design for test architecture for wide input/output stacked DRAM dies.

FIG. 7 illustrates on a process 7000 implementing a design for test architecture for wide input/output stacked DRAM dies. At block 7002, process 7000 mounts an interposer on a package substrate. The logic die is mounted on the interposer, at block 7004. The logic die includes a control logic wrapped with a processor wrapper. The processor wrapper is configured to enable testing components of the control logic. A memory die is mounted a on the interposer, block 7006. The memory die includes dynamic random access memory and channel selection/bypass logic; the control logic is coupled to the dynamic random access memory via the channel selection/bypass logic, the channel selection/bypass logic is controlled by the processor wrapper.

The previous description of the embodiments is provided to enable any person skilled in the art to practice the invention. The various modifications to these embodiments will be readily apparent to those skilled in the art, and the generic principles defined herein may be applied to other embodiments without the use of inventive faculty. Thus, the current disclosure is not intended to be limited to the embodiments shown herein, but is to be accorded the widest scope consistent with the principles and novel features disclosed herein.

What is claimed is:

1. A 2.5D test architecture comprising:
an interposer mounted on a package substrate;
a logic die mounted on the interposer, the logic die including a control logic wrapped with a processor wrapper, the processor wrapper being configured to enable testing components of the control logic;
a memory die mounted on the interposer, the memory die including dynamic random access memory and channel selection/bypass logic, the control logic is coupled to the dynamic random access memory via the channel selection/bypass logic, the channel selection/bypass logic being controlled by the processor wrapper.

2. The 2.5D test architecture of claim 1, wherein the logic die further comprises:

a boundary scan wrapper configured to wrap the processor wrapper, the boundary scan wrapper being configured to enable testing components of a board.

3. The 2.5D test architecture of claim 2, wherein channel selection/bypass logic is configured to select an individual channel for interconnect testing between the logic die and the memory die.

4. The 2.5D test architecture of claim 3, wherein the processor wrapper also wraps at least one wrapper register, a wrapper instruction register, and a logic-to-data adapter.

5. The 2.5D test architecture of claim 4, wherein the processor wrapper has serial test access mechanisms.

6. The 2.5D test architecture of claim 5, wherein the processor wrapper has parallel test access mechanisms.

7. The 2.5D test architecture of claim 6, wherein the control logic is a system on a chip.

8. The 2.5D test architecture of claim 7, wherein the control logic also includes a wide input/output controller.

9. The 2.5D test architecture of claim 8, wherein the processor wrapper is an Institute of Electrical and Electronics Engineers (IEEE) Std. 1500 wrapper.

10. The 2.5D test architecture of claim 9, wherein the processor wrapper is wrapper is an Institute of Electrical and Electronics Engineers Std. 1500 wrapper.

11. A 3D test architecture comprising:
a logic die mounted on a package substrate, the logic die including a control logic wrapped with a processor wrapper, the processor wrapper being configured to enable testing components of the control logic;
a memory die mounted on the logic die, the memory die including dynamic random access memory and channel selection/bypass logic, the control logic is coupled to the dynamic random access memory via the channel selection/bypass logic, the channel selection/bypass logic being controlled by the processor wrapper.

12. The 3D test architecture of claim 11, wherein the logic die further comprises:
a boundary scan wrapper configured to wrap the processor wrapper, the boundary scan wrapper being configured to enable testing components of a board.

13. The 3D test architecture of claim 12, wherein channel selection/bypass logic is configured to select an individual channel for interconnect testing between the logic die and the memory die.

14. The 3D test architecture of claim 13, wherein the processor wrapper also wraps at least one wrapper register, a wrapper instruction register, and a logic-to-data adapter.

15. The 3D test architecture of claim 14, wherein the processor wrapper has serial test access mechanisms.

16. The 3D test architecture of claim 15, wherein the processor wrapper has parallel test access mechanisms.

17. The 3D test architecture of claim 16, wherein the control logic is a system on a chip.

18. The 3D test architecture of claim 17, wherein the control logic also includes a wide input/output controller.

19. The 3D test architecture of claim 18, wherein the processor wrapper is an Institute of Electrical and Electronics Engineers (IEEE) Std. 1500 wrapper.

20. A method comprising:
mounting an interposer on a package substrate;
mounting a logic die on the interposer, the logic die including a control logic wrapped with a processor wrapper, the processor wrapper being configured to enable testing components of the control logic;
mounting a memory die on the interposer, the memory die including dynamic random access memory and channel selection/bypass logic, the control logic is coupled to the dynamic random access memory via the channel selection/bypass logic, the channel selection/bypass logic being controlled by the processor wrapper.

* * * * *